United States Patent
Ihara

(10) Patent No.: US 6,667,235 B2
(45) Date of Patent: Dec. 23, 2003

(54) SEMICONDUCTOR DEVICE AND MANUFACTURING METHOD THEREFOR

(75) Inventor: Yoshihiro Ihara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 94 days.

(21) Appl. No.: 09/733,078

(22) Filed: Dec. 11, 2000

(65) Prior Publication Data

US 2001/0004133 A1 Jun. 21, 2001

(30) Foreign Application Priority Data

Dec. 15, 1999 (JP) ............................................. 11-355229

(51) Int. Cl.$^7$ .............................................. H01L 21/44
(52) U.S. Cl. ........................................ 438/678; 438/666
(58) Field of Search ........................... 257/735; 438/678, 438/666, 745

(56) References Cited

U.S. PATENT DOCUMENTS

| | | | |
|---|---|---|---|
| 4,710,592 A | * 12/1987 | Kimbara | ...................... 361/414 |
| 5,310,700 A | * 5/1994 | Lien et al. | .................. 438/618 |
| 5,619,071 A | 4/1997 | Myers et al. | ................. 257/753 |
| 5,874,358 A | * 2/1999 | Myers et al. | ................. 438/640 |
| 6,097,094 A | * 8/2000 | Ishigami | ...................... 257/763 |
| 6,160,316 A | * 12/2000 | Gardner et al. | ............. 257/773 |
| 2001/0028108 A1 | * 10/2001 | Higashi et al. | .............. 257/735 |

FOREIGN PATENT DOCUMENTS

EP     1 003 209 A1    5/2000

* cited by examiner

*Primary Examiner*—Phat X. Cao
(74) *Attorney, Agent, or Firm*—Staas & Halsey LLP

(57) ABSTRACT

An undercut portion is provided in the side surface of a wiring pattern formed over the electrode terminal forming surface of a semiconductor element so that when the top of the electrode terminal forming surface of the semiconductor element is sealed, a semiconductor device can be obtained wherein that sealing layer exhibits high adhesion. The side surface of the wiring pattern having this undercut portion can be obtained by forming the wiring pattern by laminating metal layers of a plurality of metals, in a layered form, in such a way that the side surface of at least a metal layer A of that wiring pattern is formed as recessed inward in comparison with the side surface of a metal layer B formed on or above that metal layer A. More specifically, the undercut portion can be obtained by performing wet etching on this side surface.

3 Claims, 9 Drawing Sheets

SEMICONDUCTOR DEVICE AND MANUFACTURING METHOD THEREFOR

BACKGROUND OF THE INVENTION

1. Field of the Invention

This invention relates to a semiconductor device having a size equivalent to that of a semiconductor element, and to a manufacturing method therefor.

2. Description of the Related Art

The configuration of an example of a conventional chip-size semiconductor device 10 is described using FIG. 5.

Over a surface of a semiconductor element 12 on which electrode terminals 14 are formed, a passivation film 16 is formed, exposing the electrode terminals 14.

On the passivation film 16, an insulation coating 18 comprising an organic resin or the like is formed, exposing the electrode terminals 14 of the semiconductor element 12.

On the insulation coating 18 is formed (a) wiring pattern (s) 20, one end of which is electrically connected to an electrode terminal 14 of the semiconductor element 12, and the other end of wiring pattern(s) 20 forms a land 20a. Item 20b is a conductive site which forms a part of the wiring pattern 20 that connects the land 20a to the electrode terminal 14 of the semiconductor element 12.

On the surfaces of lands 20a, columnar electrodes 26 are arranged in an upright posture, and a sealing layer 28 is formed for sealing the wiring pattern 20, while exposing the top end surfaces of the columnar electrodes 26.

On the top end surfaces of the columnar electrodes 26 are formed plating layers 22 of nickel plating and gold plating, rendered successively.

Also, externally connecting terminals 24 are formed on the top end surfaces (that is, the surfaces of the plating layers 22) of the columnar electrodes 26, the top end surfaces being exposed out of the sealing layer 28.

In a semiconductor device 10 such as this, when the semiconductor device 10 is mounted on a mounting board (not shown), the wiring pattern 20 tends to be subjected to stress owing to the difference in the coefficients of thermal expansion between the semiconductor element 12 and the mounting board (a resin circuit board, for example).

Thereupon, the columnar electrodes 26 having an elongated shape are interposed between the externally connecting terminals 24 and the wiring pattern(s) 20, and the columnar electrodes 26 themselves absorb and ease that stress.

A summary of the manufacturing method for the semiconductor device 10 wherein a wiring pattern 20 is formed over the semiconductor element 12 as described above, is now described using FIGS. 6 to 10.

First, as diagrammed in FIG. 6, on the passivation film 16 that is on top of the semiconductor element 12, the insulation coating 18 made of a polyimide resin is formed, excluding the sites for the electrode terminals 14.

Next, as diagrammed in FIG. 7, a metal film 25 comprising an adhesive metal layer 25a made of titanium or chromium and a copper layer 25b is formed by sputtering so that the thicknesses of the layers 25a and 25b are on the order of approximately 0.05 to 0.2 μm and approximately 0.5 μm or so, respectively.

Next, as diagrammed in FIG. 8, a resist pattern 27 is formed in such a way that part of the copper layer 25b is left exposed for forming a wiring pattern (rewiring pattern) in the shape of groove, and, using this resist pattern 27 as a plating mask, and using the metal film 25 as a conductive layer, a plating film is formed by electrolytic copper plating on the metal film 25 to make the wiring pattern 20. The metal layer formed by this electrolytic copper plating constitutes the basic part of the wiring pattern 20.

After forming the wiring pattern 20, the resist pattern 27 is removed.

Next, as diagrammed in FIG. 9, a plating resist layer 29 is formed over the semiconductor element 12 on which the wiring pattern 20 is formed, light exposure and developing are performed, a hole 31 is formed in the resist layer 29, and the land 20a of the wiring pattern 20 is exposed.

Next, as diagrammed in FIG. 10, a plating film is formed by electroplating (copper, nickel, or the like) on the land 20a inside the hole 31, and the columnar electrode 26 is formed (to a height of approximately 100 μm) by filling in the hole 31.

Furthermore, on the top end surface of this columnar electrode 26, a plating layer 22 comprising a nickel plating film and a gold plating film is formed. The plating layer 22 may also be a two-layer plating film wherein a nickel plating film and a palladium plating film are formed successively.

Next, the resist layer 29 is removed. Then, using the wiring pattern 20 as an etching mask pattern, etching is performed to remove the exposed metal film 25 (the copper layer 25b and adhesive metal layer 25a), thus making the wiring pattern(s) 20 independent.

In this manner, the insulation coating 18, the wiring pattern(s) 20, and the columnar electrodes 26 are formed on the semiconductor element 12 (FIG. 10).

Next, as diagrammed in FIG. 11, over the surface of the semiconductor element whereon the electrode terminals 14 are formed, the sealing layer 28 for sealing that semiconductor element surface is formed, using a resin having electrically insulative properties.

To describe this in greater detail, the sealing layer 28 is formed in such a way that the top end surface of the columnar electrodes 26 is exposed. Externally connecting terminals 24 such as solder balls, for example, are joined to the top end surfaces of the columnar electrodes 26 exposed out of the sealing layer 28.

The process steps up to this point are usually performed on a semiconductor wafer whereon a plurality of semiconductor elements are formed.

Then, last of all, the wafer is cut out into separate pieces according to respective semiconductor elements, so that the semiconductor device 10 diagrammed in FIG. 5 can be manufactured.

FIG. 13 is a perspective view of one example of a semiconductor device manufactured in this way.

FIG. 14 is a sectional side view of one example of a semiconductor device manufactured in this way. In this case, no columnar electrodes are installed.

FIG. 15 is a diagram of one example of a semiconductor device manufactured in this way, viewed from the top.

This figure is rendered so that the wiring pattern, etc. can be seen through the sealing layer.

In the semiconductor device 10 described above, since the coefficients of thermal expansion differ greatly between the semiconductor element 12 and the sealing layer 28 coating over and sealing the top of the surface of the semiconductor element 12 whereon the electrode terminals are formed (electrode terminal forming surface of the semiconductor element 12), it is considered to be necessary that the sealing layer 28 should not be easily peeled away from the adhesion surface thereof by the temperature fluctuation.

In the conventional semiconductor device 10, the sealing layer 28 is held onto the top of the electrode terminal forming surface of the semiconductor element 12 by two adhesive forces, namely the adhesive force between the sealing layer 28 and the insulation coating 18 formed over the electrode terminal forming surface of the semiconductor element 12, and the adhesive force between the wiring pattern 20 and the sealing layer 28.

Also, because the adhesive force between resin layers is the larger of these two adhesive forces, the greater part of the overall adhesive force is accounted for by the adhesive force between the insulation coating 18 formed of a polyimide resin or the like and the sealing layer 28.

However, as the number of the electrode terminals 14 on the semiconductor element 12 has been increasing, and the area of the wiring pattern(s) 20 formed over the electrode terminal forming surface has been increasing due to the miniaturization and the implementation of higher densities in recent years, the proportion of the exposed portion of the insulation coating 18 declines, resulting in a problem of a declined adhesive force of the sealing layer 28 over the electrode terminal forming surface as a whole.

Therefore, the present invention has been made to solve the above-described problems and aims at providing a semiconductor device and the manufacturing method therefor wherein a sealing layer shows excellent adhesive properties when it seals the electrode terminal forming surface of the semiconductor element.

SUMMARY OF THE INVENTION

Specifically, the invention in this application is as follows.
1. A semiconductor device comprising
   a wiring pattern which is connected electrically, at one end thereof, to an electrode terminal formed on the electrode terminal forming surface of a semiconductor element, and forms, at the other end thereof, a land connected to an externally connecting terminal, the wiring pattern being formed over the electrode terminal forming surface of that semiconductor element, and the wiring pattern having a side surface with an undercut portion.
2. The semiconductor device according to 1 above, wherein the wiring pattern is formed by laminating metal layers of a plurality of metals in a layered form, and the side surface of at least one metal layer A in that wiring pattern is formed as recessed inward in comparison with the side surface of a metal layer B formed on or above the metal layer A.
3. The semiconductor device according to 2 above, wherein the metal layer A is formed by copper plating, and the metal layer B is formed by nickel plating or nickel alloy plating.
4. A method for manufacturing a semiconductor device wherein a wiring pattern, one end of which is connected electrically to an electrode terminal formed on the electrode terminal forming surface of a semiconductor element, and the other end of which forms a land connected to an externally connecting terminal, is formed over the semiconductor, comprising the steps of:
   forming the wiring pattern by laminating metal layers comprising a plurality of metals in a layered form; and
   etching the side surface part of the wiring pattern.
5. The method of manufacturing a semiconductor device according to 4 above, wherein the wiring pattern is formed by laminating metal layers in a layered form with a nickel or nickel alloy plating layer on a layer formed by copper plating.
6. The method of manufacturing a semiconductor device according to 5 above, further comprising the steps of:
   forming an insulation coating over the electrode terminal forming surface, exposing the electrode terminal;
   forming a metal film on the insulation coating and the electrode terminal;
   forming a resist pattern on the metal film in such a way that sites for forming the wiring pattern are exposed;
   removing the resist pattern after forming that wiring pattern by laminating layers; and
   etching and removing the metal film that is exposed, using that wiring pattern as a mask pattern.
7. The method of manufacturing a semiconductor device according to 6 above, wherein the metal film is formed on a metal film of chromium by laminating a metal film of copper in a layered form.

It was discovered that, when the side surface portion of the wiring pattern described above has an undercut portion, the adhesive properties of the sealing layer 28 can be greatly improved. By "undercut" here, it is meant that a side surface of the wiring pattern 20 is structured so that a lower portion thereof is recessed in comparison with an undercut portion thereover, as diagrammed in FIGS. 12A, 12B, and 12C. The effect on the present invention is thought to be obtained due to a so-called anchor effect that is produced by the resin which fills in the recess and thus opposes the "force pulling upward", when a force is developed to pull the sealing layer 28 upward as diagramed in FIGS. 12A, 12B, and 12C.

Such an undercut structure may be prepared by any known method whatever. It is also possible, for example, to effect plating so that the uppermost plating layer overhangs, as diagrammed in FIG. 12A.

Also, in a case where, for example, the wiring pattern comprises a metal layer X (exemplified in FIG. 12B) consisting of a metal that is readily eroded by wet etching and a metal layer Y (exemplified in FIG. 12B) formed thereover that consists of a metal this is highly resistant to erosion by wet etching, it is possible to form an undercut such as that diagrammed in FIG. 12A by performing wet etching to etch the side surface portion of X relatively more than the side surface portion of the Y layer. This method is technically simple and is to be preferred.

Needless to say, laminating a metal layer is not an indispensable condition for forming the undercut.

Moreover, in cases where the wiring pattern consists of a plurality of metal layers, it is preferable that the metal layer that will be the basic part of the wiring pattern be formed by copper plating, and that the metal layer formed thereon be formed by nickel plating or nickel alloy plating for the purpose of easier undercut formation.

In that case, it is not always necessary that the metal layer that is on or above the metal layer to be etched to a greater extent be immediately located on top of the very metal layer etched to a greater extent, but the effectiveness of the undercut (effectiveness of the recess) is more greatly manifested with the structure wherein the metal layer is immediately on top of the very metal layer etched to a greater extent. This is therefore to be preferred.

It is noted that, as described in the foregoing, when fabricating a semiconductor device, a process step is commonly incorporated for removing, by etching, the exposed electrically conductive metal film, and it sometimes happens during the process that the cross section of the metal film will be more recessed than the cross section of the wiring pattern as a mask pattern for etching, resulting in producing an undercut structure. However, such an undercut makes little contribution to improving the adhesive properties of the sealing layer 28, and it is important to have an undercut on the wiring pattern itself.

The reason for this is not clear, but it is conjectured that the reason is that, with the metal film having a thickness of about 0.5 to 0.7 µm, it is difficult for the sealant itself to enter the recess, and that adequate rigidity cannot be secured to oppose a pulling force from above, even if it has entered the recess.

The present invention also includes the methods 4 to 7 noted above.

More specifically, as per the foregoing, etching of the side surface portions of the layered metals of the wiring pattern is a preferable method. Dry etching or wet etching may be applied. Wet etching is preferred since a difference in etching speed between metals can easily be effected by the method.

It is preferable that the metal film noted above be formed by laminating a metal film of copper in a layered form on a metal film of chromium.

As the wiring patterns based on the present invention provide a great effect, it will be effective, in the sense of enhancing the adhesive properties of the sealing layer, to take a positive measure of installing a wiring pattern as a dummy wiring, at a location where there is no functional need for rewiring, and at a location where the number (density) of the original wiring patterns is small, for the purpose of obtaining the anchor effect as the object of the present invention. It is noted, in that case, there is naturally no need to connect those wiring patterns to the semiconductor electrode terminals or externally connecting terminals.

DESCRIPTION OF THE PREFERRED EMBODIMENTS

Preferred embodiments of the semiconductor device and the manufacturing method therefor according to the present invention are now described in detail. The same symbols are applied to configurations that are the same as in the conventional example(s), and no further description thereof is given here.

It is noted that the following are merely embodiments of the semiconductor device and the manufacturing method therefor according to the present invention, and they do not limit the scope of the present invention.

Figure 1A:
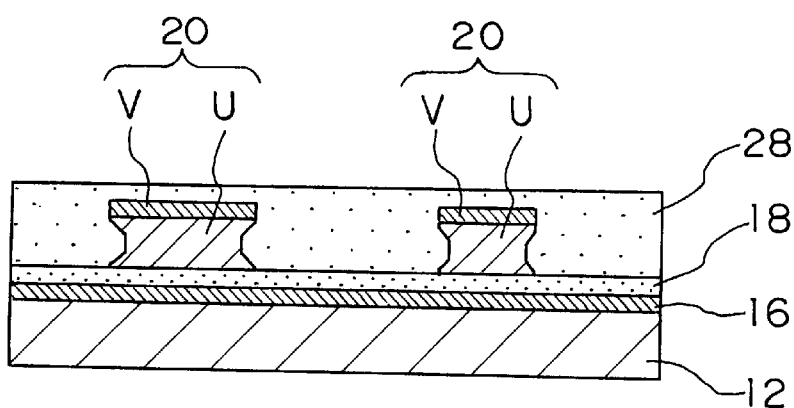
FIG. 1A is a cross-sectional view representing the structure of a wiring pattern in one embodiment of a semiconductor device according to the present invention.
Figure 2A:
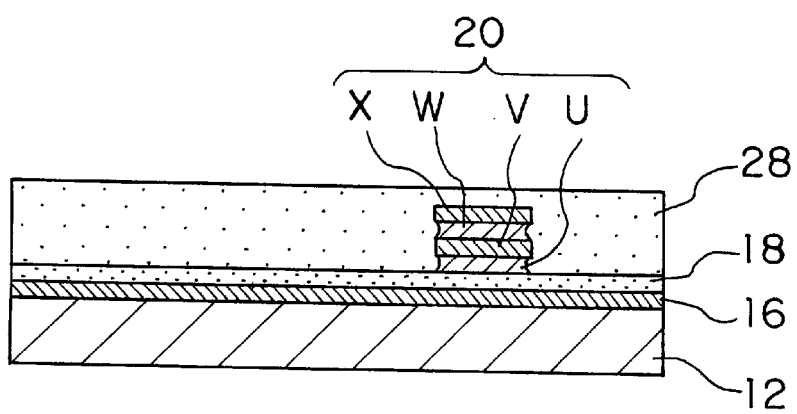
FIG. 2A is a cross-sectional view representing the structure of a wiring pattern in another embodiment of a semiconductor device according to the present invention.

A description is given first of the fundamental concept of the present invention, making reference to FIG. 1A and FIG. 2A.

When a wiring pattern 20 is formed over an electrode terminal forming surface of a semiconductor element 12, the wiring pattern 20 is formed by laminating metal layers of different metals in a layered form (in FIG. 1A, as an example, two metal layers U and V, in a layered form) to constitute a configuration in which a plurality of metal layers are laminated. The side surface of the metal layer U that is a lower layer and is the basic part of the wiring pattern 20, is configured to be recessed inward in comparison with the side surface of the metal layer V formed immediately on the metal layer U. Thereby, the side surface of the wiring pattern 20 takes on an uneven configuration. That is, the recessed portion thereof becomes an undercut.

Accordingly, when a resin exhibiting electrically insulative properties is coated over the electrode terminal forming surface to form a sealing layer 28, and the top of the electrode terminal forming surface is sealed, the resin enters the recessed part of the side surface from the periphery of the wiring pattern 20, bonds with the wiring pattern 20, and exhibits an anchor effect. The adhesive properties of the sealing layer 28 are thereby enhanced.

The wiring pattern 20, furthermore, may be formed in multiple layers numbering three or more (four layers U, V, W, and X, for example) as diagrammed in FIG. 2A, so that the side surfaces of the metal layers U and W constituting the basic parts of the wiring pattern 20 are formed in such a way that they are recessed inward in comparison with the side surfaces of the metal layers V and X formed immediately thereon, respectively. It is believed that the number of sites where bonding is effected with the sealing layer 28 increases thereby, and that the anchor effect is enhanced even more.

Next, the configuration of the semiconductor device and the manufacturing method for the semiconductor device are described. Since the configuration of and manufacturing method for the semiconductor device have much in common with the conventional example, FIGS. 5 to 10 are used in conjunction with FIGS. 1 to 4.

Figure 5:
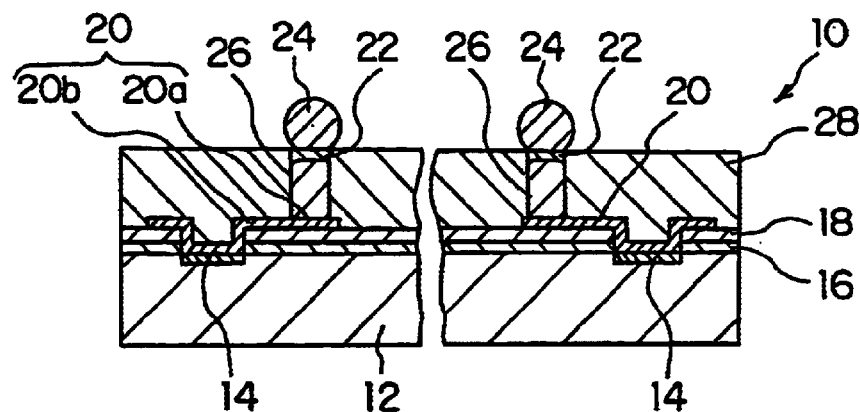
FIG. 5 is a cross-sectional view representing the configuration of a semiconductor device wherein bump-shaped externally connecting terminals are formed on columnar electrodes formed on the lands of the wiring pattern.

Turning first to the configuration of the semiconductor device according to the present invention, the basic configuration is as diagrammed in FIG. 5. The configuration differs from that of the prior art in that the wiring pattern 20, as described earlier and diagrammed in FIG. 1A and FIG. 2A, is formed by laminating metal layers of different metals, in a layer form (two layers in FIG. 1A, namely the metal layers U and V, and four layers in FIG. 2A, namely the metal layers U, V, W, and X), into a configuration wherein the side surface of the metal layer U (and also the metal layer W in FIG. 2A) constituting the basic part of the wiring pattern 20 is recessed inward in comparison with the side surface of the metal layer V (and also the metal layer X in FIG. 2A) formed directly on the metal layer U.

This recessed structure, as will be described subsequently, can be formed, for example, by subjecting the side surface of a wiring pattern configured with no recess on the side surface as diagrammed in FIG. 1B and FIG. 2B to etching or the like.

Next, a manufacturing method for the semiconductor device according to the present invention is described.

Figure 6:
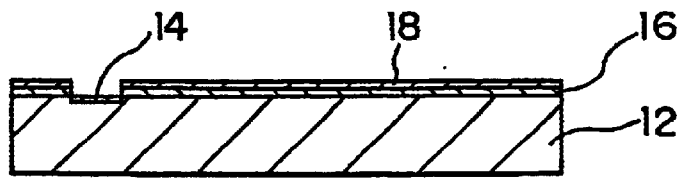
FIG. 6 is an explanatory diagram for describing a manufacturing method for the semiconductor device diagrammed in FIG. 5, showing a state wherein an insulation coating and a passivation film are formed on a wafer.
Figure 7:
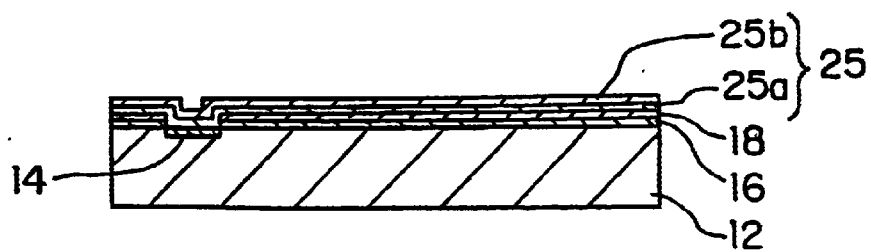
FIG. 7 is an explanatory diagram for a state wherein an electrically conductive layer (a metal film comprising an adhesive metal layer and a copper layer) is formed on the insulation coating diagrammed in FIG. 6.
Figure 8:
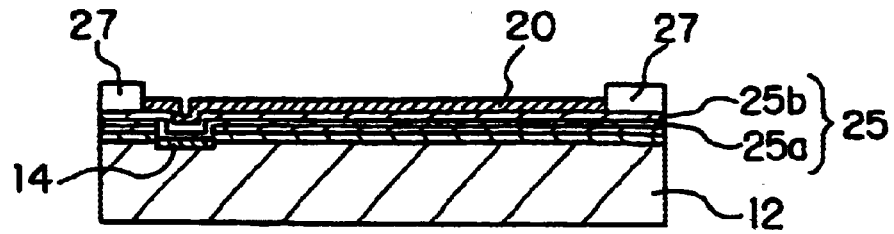
FIG. 8 is an explanatory diagram for a state wherein a wiring pattern is formed on the electrically conductive layer (a metal film comprising an adhesive metal layer and a copper layer) diagrammed in FIG. 7.

The steps from the process step as diagrammed in FIG. 6 for forming the insulation coating 18 over the electrode terminal forming surface of the semiconductor element 12 with the electrode terminal 14 being exposed, to the process step as diagrammed in FIG. 7 for forming the metal film 25 on the insulation coating 18, and further to the process step as diagrammed in FIG. 8 for forming the resist pattern 27 wherein the metal film 25 is exposed at the sites where the wiring pattern 20 is formed, are exactly the same as those in the prior art.

Next, in the process step as diagrammed in FIG. 8 for forming the wiring pattern 20 on the exposed metal film 25 using the resist pattern 27 as a mask for plating, a metal layer of a different metal is further formed by lamination, for example in the embodiment according to the present invention, on the metal layer formed by electrolytic copper plating that is the metal constituting the basic part of the wiring pattern 20, whereas, in the conventional example, one metal layer having a thickness of 5 to 20 μm or so is formed by electrolytic copper plating to form a wiring pattern.

Specifically, a metal layer formed by electrolytic nickel plating or electrolytic nickel alloy plating is preferably laminated directly on the metal layer constituting the basic part of the wiring pattern 20.

Figure 1B:
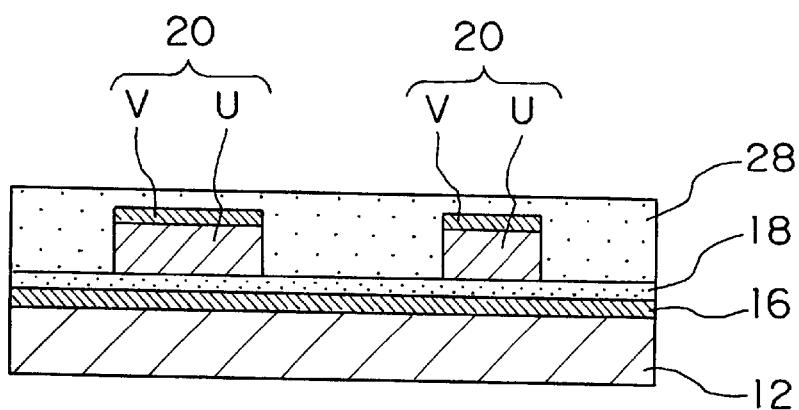
FIG. 1B is a cross-sectional view showing the state of the wiring pattern diagrammed in FIG. 1A prior to providing an undercut structure.
Figure 2B:
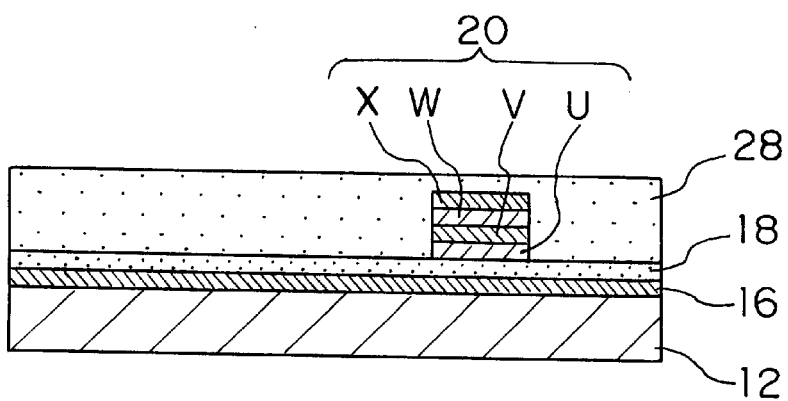
FIG. 2B is a cross-sectional view showing the state of the wiring pattern diagrammed in FIG. 2A prior to providing an undercut structure.

Referring to FIG. 1B noted earlier, the metal layer formed by electrolytic copper plating is the U layer, and the metal layer formed by electrolytic nickel plating is the V layer.

By repeatedly performing this metal layer lamination, moreover, the wiring pattern 20 can be formed in multiple layers of 3 or more.

Next, the resist pattern 27 is removed, as in the conventional example.

Figure 9:
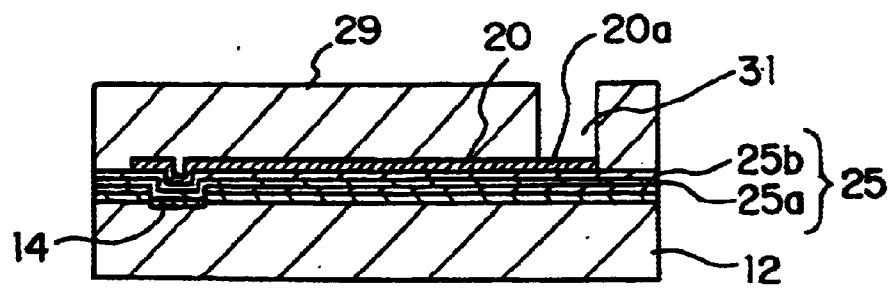
FIG. 9 is an explanatory diagram for a state wherein a columnar electrode is to be formed on a land of the wiring pattern diagrammed in FIG. 8.

Following that, as in the conventional example, the process step diagrammed in FIG. 9 is implemented, in which a plating resist layer 29 having a hole 31 for exposing the land 20a is formed, and the columnar electrode 26 is formed.

After forming the columnar electrode 26, the resist layer 29 is removed.

Figure 10:
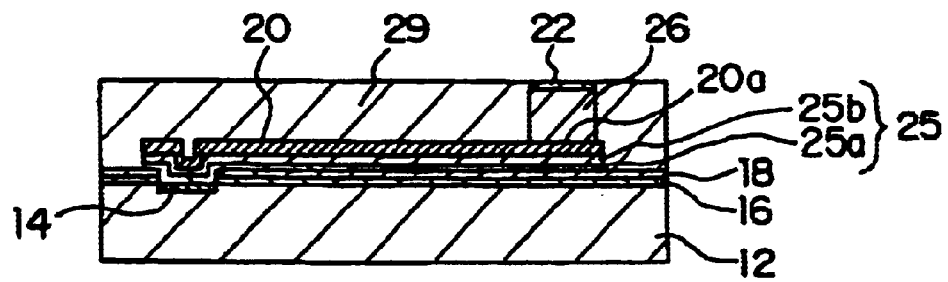
FIG. 10 is an explanatory diagram of a state wherein the resist layer diagrammed in FIG. 9 has been removed, the electrically conductive layer (a metal film comprising an adhesive metal layer and a copper layer) has been removed by etching, and each wiring pattern has been made independent.

Next, in the process step diagrammed in FIG. 10, that is, in the process step for making the wiring pattern 20 independent, the metal film 25 (copper layer 25b and adhesive metal layer 25a) exposed on the semiconductor element is removed by etching using the wiring pattern 20 as a mask pattern. The side surface of the metal layer U (the U and W layers in FIG. 2B) constituting the basic part of the wiring pattern 20 is etched and recessed inward in comparison with the side surface of the metal layer V (the V and X layers in FIG. 2B) at the same time.

The etching liquid used in this process step is one that will etch the metal film 25 and the metal layers (U and W layers) constituting the basic part of the wiring pattern 20, but that will not erode the metal layers directly thereon (the V and X layers).

Figure 11:
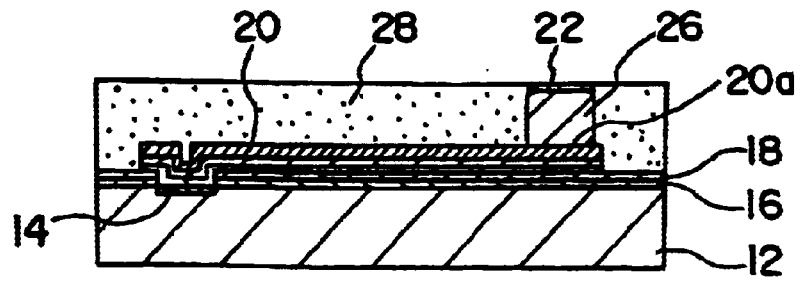
FIG. 11 is an explanatory diagram representing a semiconductor device sealed with a sealing layer 28.
Figure 12A:
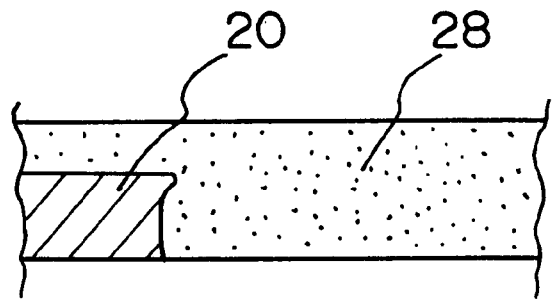
FIGS. 12A, 12B, and 12C are model diagrams representing undercuts.
Figure 12B:
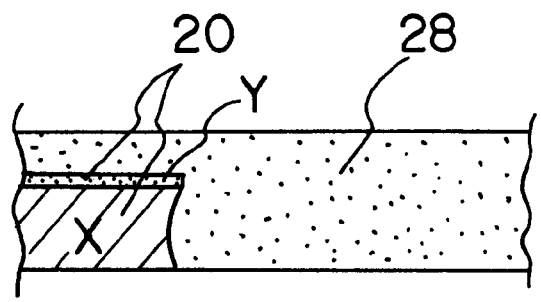
Figure 12C:
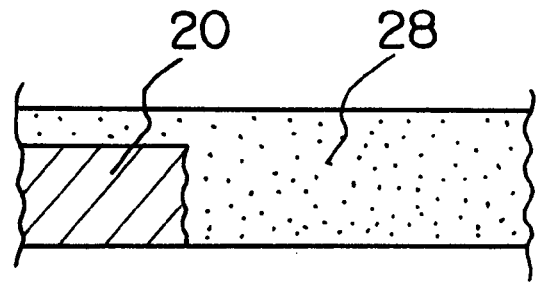
Figure 13:
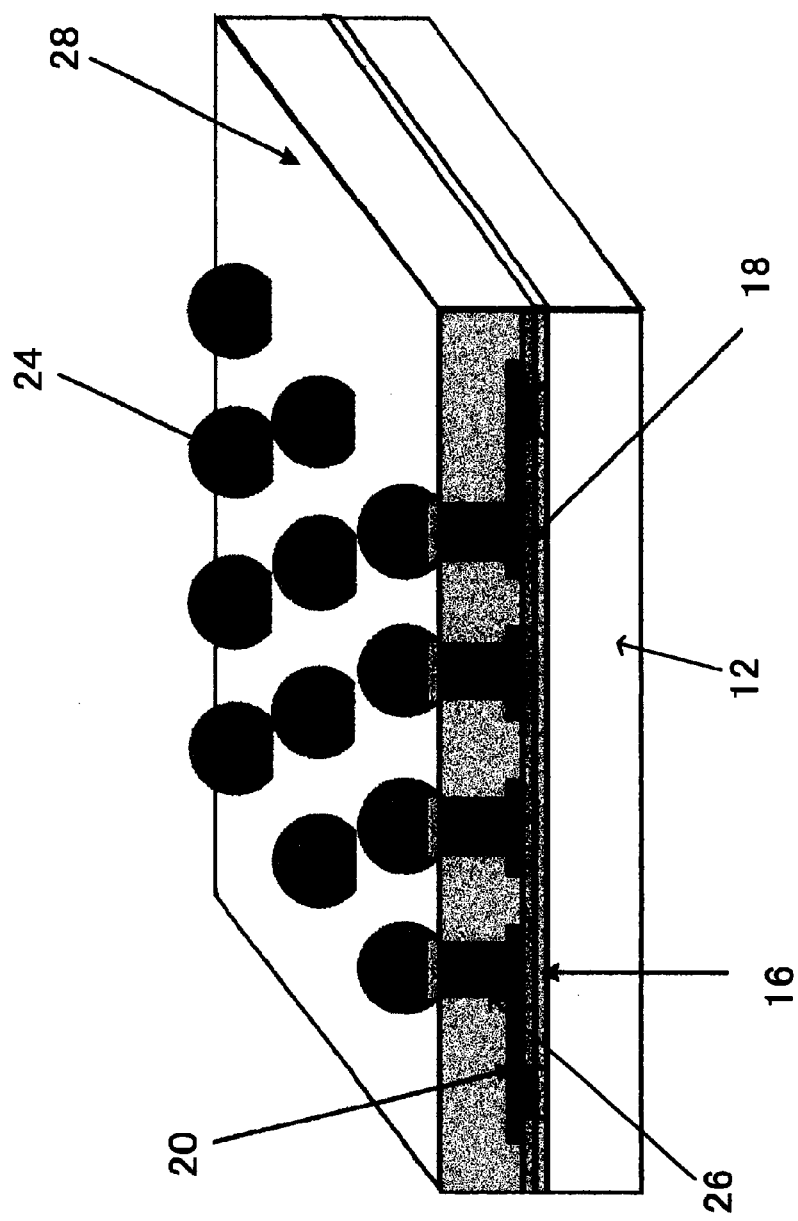
FIG. 13 is a perspective view of one example of a semiconductor device.
Figure 14:
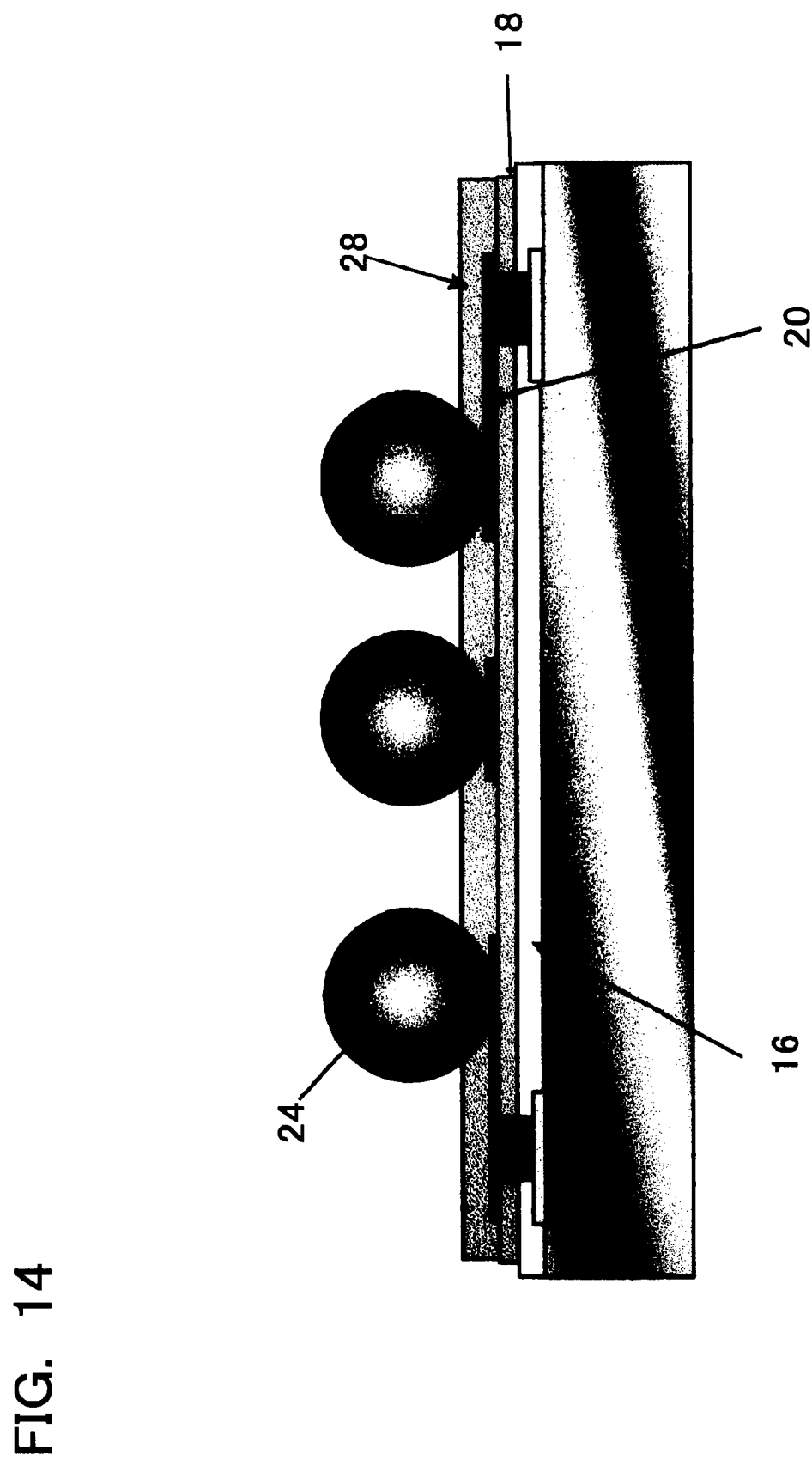
FIG. 14 is a sectional side view of one example of a semiconductor device.
Figure 15:
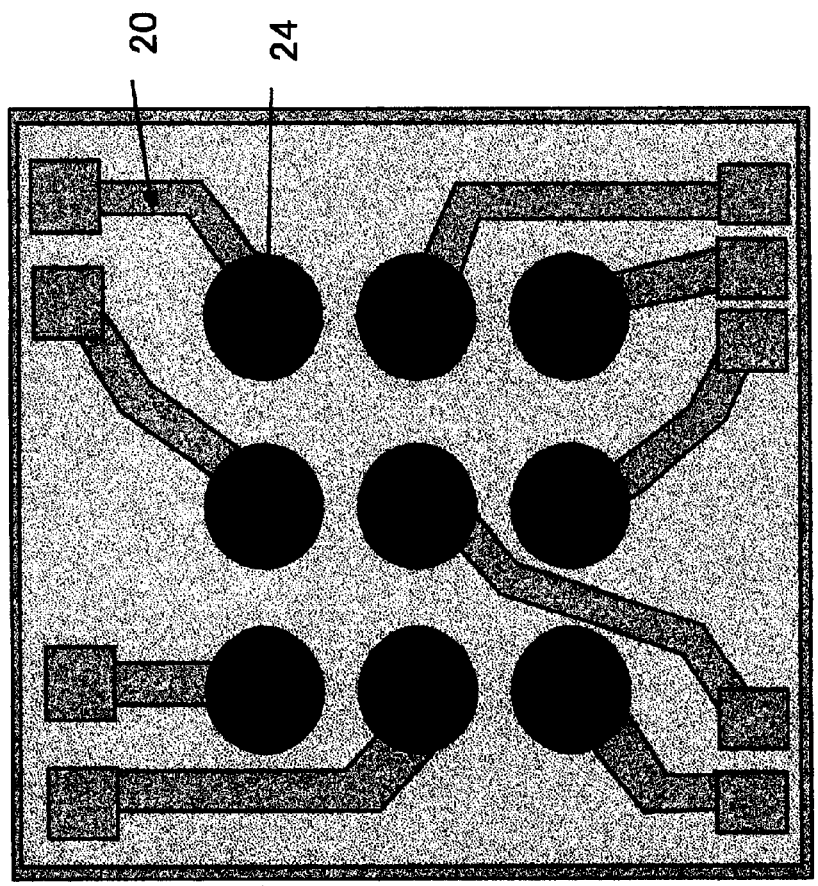
FIG. 15 is a diagram of a semiconductor device viewed from the top.

Next, as in the conventional example and as diagrammed in FIG. 11, the sealing layer 28 is formed over the electrode terminal forming surface of the semiconductor element 12, externally connecting terminals 24 (solder bumps) are formed on the top end surface of the columnar electrode 26 that is exposed out of the sealing layer 28, and, last of all, the wafer is cut into individual pieces according to respective semiconductor elements 12 to complete the semiconductor device according to the present invention.

Figure 3:
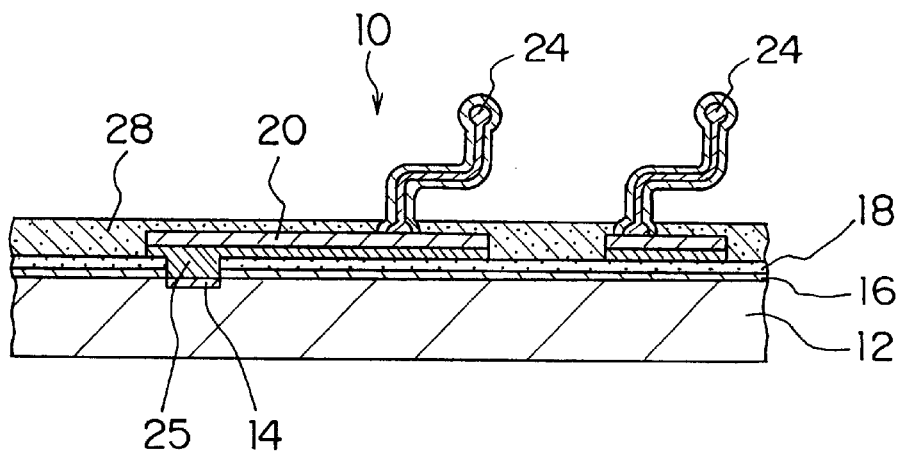
FIG. 3 is a cross-sectional view of the structure of a semiconductor device wherein externally connecting terminals are configured by bending gold wires into L shapes.

While, in the embodiment described in the foregoing, the configuration is such that externally connecting terminals 24 are formed in bump shapes on the top end surfaces of the columnar electrodes 26, the semiconductor device may have a configuration wherein gold wires are bent into L shapes and bonded directly onto the lands 20a, as exemplified in FIG. 3.

Figure 4:
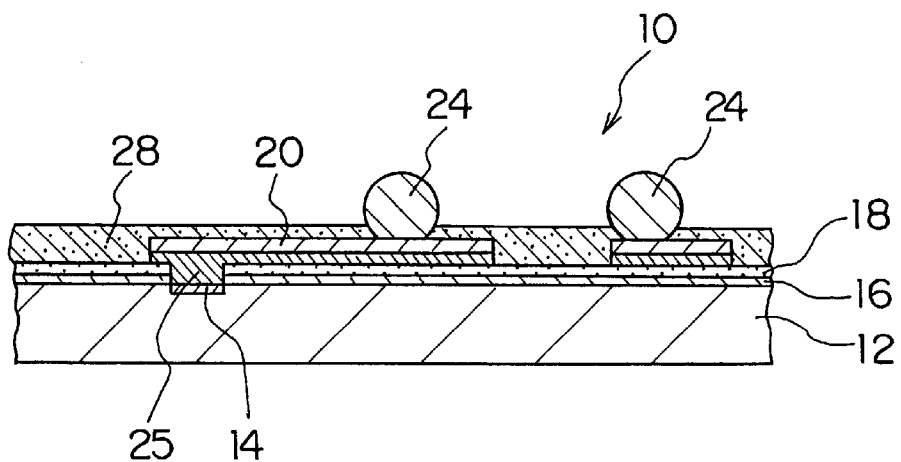
FIG. 4 is a cross-sectional view of the configuration of a semiconductor device wherein bump-shaped externally connecting terminals are formed directly on top of the lands of the wiring pattern.

Also, a semiconductor device may have a configuration wherein the externally connecting terminals 24 in the same bump shapes are formed directly on the lands 20a, without forming columnar electrodes 26, as diagrammed in FIG. 4.

In one example of a process step in which the externally connecting terminals 24 are formed directly on the wiring pattern(s) 20 as explained above, a gold plating layer is formed as the uppermost layer by gold plating, after a metal layer is formed by electrolytic nickel plating directly on the metal layer formed by electrolytic copper plating in the process step diagrammed in FIG. 8.

Then, after removing the resist pattern 27, the process step for forming the columnar electrodes 26 diagrammed in FIG. 9 is skipped, and the resist layer 29 is formed in such a state that the lands 20a are exposed as diagrammed in FIG. 9, in the case of externally connecting terminals 24 having the shape diagrammed in FIG. 3. Then gold wires are bent into L shapes to be bonded directly to the lands 20a so as to form the externally connecting terminals 24, and the surfaces of the gold wires are covered by nickel alloy plating for reinforcing. After that, the resist layer 29 is removed, and the metal film 25 is removed by etching, using the wiring pattern 20 as a mask pattern. During the time, the side surfaces of the metal layer U (the metal layer formed by electrolytic copper plating) of the wiring pattern 20 is also etched and recessed.

After that, a solder resist is coated over the electrode terminal forming surface of the semiconductor element 12 to form the sealing layer 28, in such a way that the externally connecting terminals 24 are exposed.

Furthermore, in the case of the externally connecting terminals 24 having the shapes diagrammed in FIG. 4, after removing the resist pattern 27, the exposed metal film 25 is removed by etching, using the wiring pattern 20 as a mask pattern. During the time, the side surface of the metal layer U (the metal layer formed by electrolytic copper plating) of the wiring pattern 20 is also etched and recessed.

After that, solder resist is coated over the electrode terminal forming surface of the semiconductor element 12 to form the sealing layer 28, in such a way that only the lands 20a are exposed, and so as to join the solder balls or other externally connecting terminals 24 to the lands 20a.

In the semiconductor device manufacturing method in the embodiment described in the foregoing, the work consists of a semiconductor wafer, but it is permissible that the work be instead an individual semiconductor element. In that case, the job of cutting the individual pieces becomes unnecessary.

According to the semiconductor device and the semiconductor device manufacturing method as described in the present invention, part of the side surface of a wiring pattern is recessed, and unevenness is formed in that side surface. Accordingly, when a sealing layer is formed over the electrode terminal forming surface, the resin of the sealing layer bonds with the unevenness of the wiring pattern, resulting in an anchor effect. Thus the adhesive properties of the sealing layer are enhanced, and a benefit is realized in that it becomes difficult for the sealing layer to peel away.

What is claimed is:

1. A method for manufacturing a semiconductor device wherein a wiring pattern, one end of which is connected electrically to an electrode terminal formed on an electrode terminal forming surface of a semiconductor element, and the other end of which forms a land connected to an externally connecting terminal, is formed over the semiconductor, comprising:

forming an insulation coating over the electrode terminal forming surface, exposing the electrode terminal;

forming a metal film on the insulation coating and the electrode terminal;

forming a resist pattern on the metal film in such a way that sites for forming the wiring pattern are exposed;

forming the wiring pattern by laminating metal layers comprising a plurality of different metals formed by electrolytic plating in a layered form; and removing the resist pattern after forming the wiring pattern; and etching the metal film and the side surface part of the wiring pattern by performing wet etching, using the wiring pattern as a mask, so that the side surface part has an undercut portion, and the metal film that has been exposed, is removed at the same time.

2. The method of manufacturing a semiconductor device according to claim 1, wherein said forming the wiring pattern comprises laminating metal layers in a layered form with a nickel or nickel alloy plating layer on a layer formed by copper plating.

3. The method of manufacturing a semiconductor device according to claim 2, wherein the metal film is formed on a metal film of chromium, by lamination a metal film of copper in a layer form.

* * * * *

UNITED STATES PATENT AND TRADEMARK OFFICE
CERTIFICATE OF CORRECTION

PATENT NO. : 6,667,235 B2
DATED : December 23, 2003
INVENTOR(S) : Yoshihiro Ihara It is certified that error appears in the above-identified patent and that said Letters Patent is hereby corrected as shown below:

Column 10,
Line 31, change "lamination" to -- laminating --

Signed and Sealed this

First Day of June, 2004

JON W. DUDAS
*Acting Director of the United States Patent and Trademark Office*